US012733206B2

(12) United States Patent
Moens et al.

(10) Patent No.: US 12,733,206 B2
(45) Date of Patent: Sep. 8, 2026

(54) VERTICAL SHIELDED GATE ACCUMULATION FIELD EFFECT TRANSISTOR

(71) Applicant: SEMICONDUCTOR COMPONENTS INDUSTRIES, LLC, Phoenix, AZ (US)

(72) Inventors: Peter Moens, Erwetegem (BE); Balaji Padmanabhan, Chandler, AZ (US); Dean E. Probst, West Jordan, UT (US); Prasad Venkatraman, Gilbert, AZ (US); Tirthajyoti Sarkar, Fremont, CA (US); Gary Horst Loechelt, Tempe, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 806 days.

(21) Appl. No.: 18/171,029

(22) Filed: Feb. 17, 2023

(65) Prior Publication Data

US 2023/0352577 A1 Nov. 2, 2023

Related U.S. Application Data

(60) Provisional application No. 63/362,418, filed on Apr. 4, 2022.

(51) Int. Cl.
*H10D 30/66* (2025.01)
*H10D 30/01* (2025.01)
(Continued)

(52) U.S. Cl.
CPC ....... *H10D 30/668* (2025.01); *H10D 30/0297* (2025.01); *H10D 62/127* (2025.01); *H10D 64/117* (2025.01)

(58) Field of Classification Search
CPC ............ H10D 30/668; H10D 30/0297; H10D 62/127; H10D 64/117
(Continued)

(56) References Cited

U.S. PATENT DOCUMENTS 9,224,823 B2 * 12/2015 Katoh .................. H10D 64/252
9,679,890 B2 6/2017 Sarkar et al.
(Continued)

FOREIGN PATENT DOCUMENTS

CN 105702739 A * 6/2016 ....... H01L 21/28008
CN 110739344 A * 1/2020 ............. H10D 30/60
WO 2019009091 A1 1/2019

OTHER PUBLICATIONS

Baliga et al., "The Accumulation-Mode Field-Effect Transistor: A New Ultralow On-Resistance MOSFET", IEEE Electron Device Letters, vol. 13, No. 8, Aug. 1992, pp. 427-429.
(Continued)

*Primary Examiner* — Igwe U Anya
(74) *Attorney, Agent, or Firm* — Brake Hughes Bellermann LLP

(57) ABSTRACT

An accumulation MOSFET includes a plurality of device cells. Each device cell includes a mesa adjoining a vertical trench is disposed in a doped semiconductor substrate. The mesa has a top mesa portion disposed on a bottom mesa portion. The top mesa portion has a width that is narrower than a width of the bottom mesa portion. The vertical trench adjoining the mesa has a top trench portion and a bottom trench portion. The top trench portion has a width that is wider than a width of the bottom trench portion. A dielectric is disposed on a sidewall of the vertical trench. A gate electrode disposed in the top trench portion forms an accumulation channel region in the top mesa portion and a shield
(Continued)

electrode disposed in the bottom trench portion forms a depletion drift region in the bottom mesa portion.

25 Claims, 10 Drawing Sheets

(51) Int. Cl.
*H10D 62/10* (2025.01)
*H10D 64/00* (2025.01)

(58) Field of Classification Search
USPC .......................................................... 257/330
See application file for complete search history.

(56) References Cited

U.S. PATENT DOCUMENTS 11,114,559 B2 * 9/2021 Park ................... H10D 30/0297
2005/0116283 A1 6/2005 Rexer et al.
2009/0001455 A1 1/2009 Thapar
2010/0140695 A1 * 6/2010 Yedinak ................. H10D 8/605 257/334
2010/0140697 A1 * 6/2010 Yedinak ............... H10D 30/668 257/334
2012/0187474 A1 7/2012 Rexer et al.
2014/0284711 A1 9/2014 Katoh et al.
2016/0141420 A1 5/2016 Chen et al.
2016/0211369 A1 7/2016 Jan et al.
2016/0247916 A1 * 8/2016 Stefanov .............. H10D 30/645
2018/0102435 A1 4/2018 Herbert et al.
2022/0123132 A1 * 4/2022 Nishi ..................... H10D 64/23

OTHER PUBLICATIONS

Partial European Search Report for counterpart EP Patent Application No. 23161090.8, mailed Aug. 16, 2023, 14 pages.
Extended European Search Report for counterpart EP Patent Application No. 23161090.8, mailed Nov. 16, 2023, 15 pages.

* cited by examiner

100

200

300

600

VERTICAL SHIELDED GATE ACCUMULATION FIELD EFFECT TRANSISTOR

RELATED APPLICATION

This application claims priority to, and the benefit of, U.S. Patent Provisional Application No. 63/362,418, filed Apr. 4, 2022, which is incorporated by reference in its entirety herein.

TECHNICAL FIELD

This description relates to semiconductor devices and technology. In particular, the description relates to metal-oxide-semiconductor field-effect transistor (MOSFET) devices.

BACKGROUND

Metal-oxide-semiconductor field-effect transistor (MOSFET) devices are used in many power switching applications. In a typical MOSFET device, a gate electrode provides turn-on and turn-off control of the device in response to an applied gate voltage. For example, in an N-type enhancement mode MOSFET, turn-on occurs when a conductive N-type inversion layer (i.e., channel region) is formed in a p-type body region in response to a positive gate voltage, which exceeds an inherent threshold voltage. The inversion layer connects N-type source regions to N-type drain regions and allows for majority carrier conduction between these regions.

In a trench MOSFET device, a gate electrode is formed in a trench that extends downward (e.g., vertically downward) from a major surface of a semiconductor material such as silicon. Further, a shield electrode may be formed below the gate electrode in the trench. Current flow in a trench MOSFET device is primarily vertical (e.g., in an N doped drift region). A device cell may, for example, include a trench that contains the gate electrode and an adjoining mesa that contains the drain, source, body, and channel regions of the device. An example trench MOSFET device may include an array of hundreds or thousands of device cells (each including a trench and an adjoining mesa).

SUMMARY

In a general aspect, an accumulation metal-oxide-semiconductor field-effect transistor (MOSFET) includes a plurality of device cells. Each device cell includes a mesa adjoining a vertical trench is disposed in a doped semiconductor substrate. The mesa has a top mesa portion disposed on a bottom mesa portion. The top mesa portion has a width that is narrower than a width of the bottom mesa portion. The vertical trench adjoining the mesa has a top trench portion and a bottom trench portion. The top trench portion has a width that is wider than a width of the bottom trench portion. A dielectric is disposed on a sidewall of the vertical trench. A gate electrode disposed in the top trench portion forms an accumulation channel region in the top mesa portion and a shield electrode disposed in the bottom trench portion forms a depletion drift region in the bottom mesa portion.

In a general aspect, an accumulation metal-oxide-semiconductor field-effect transistor (MOSFET) includes a mesa formed between a pair of vertical trenches in a semiconductor substrate. The mesa has a top mesa portion disposed on a bottom mesa portion. The top mesa portion has a width that is narrower than a width of the bottom mesa portion. The mesa includes an accumulation channel region and a drift region. A source region is disposed in the mesa, and a dielectric is disposed on a sidewall of mesa. A gate electrode is disposed in the pair of vertical trenches, the gate electrode being biased to form the accumulation channel region in the top mesa portion across the dielectric disposed on the sidewall of the mesa. Further, a super-junction structure including a n-doped column and a p-doped column is disposed on the semiconductor substrate, and a current redistribution layer is disposed between the mesa and the super-junction structure.

In a general aspect, a method for fabricating an accumulation MOSFET includes forming a mesa adjoining a vertical trench in a doped semiconductor substrate. The mesa has a top mesa portion disposed on a bottom mesa portion. The top mesa portion has a width that is narrower than a width of the bottom mesa portion. The vertical trench has a top trench portion adjoining the top mesa portion and a bottom trench portion adjoining the bottom mesa portion. The top trench portion has a width that is wider than a width of the bottom trench portion.

The method further includes disposing a dielectric on a sidewall of the vertical trench, disposing a gate electrode in the top trench portion, and disposing a shield electrode in the bottom trench portion. The gate electrode is configured to form an accumulation channel region in the top mesa portion across the dielectric disposed on the sidewall of the mesa, and the shield electrode is configured to form a depletion drift region in the bottom mesa portion across the dielectric disposed on the sidewall of the mesa.

The details of one or more implementations are set forth in the accompanying drawings and the description below. Other features will be apparent from the description and drawings, and from the claims.

DESCRIPTION

Figure 1:
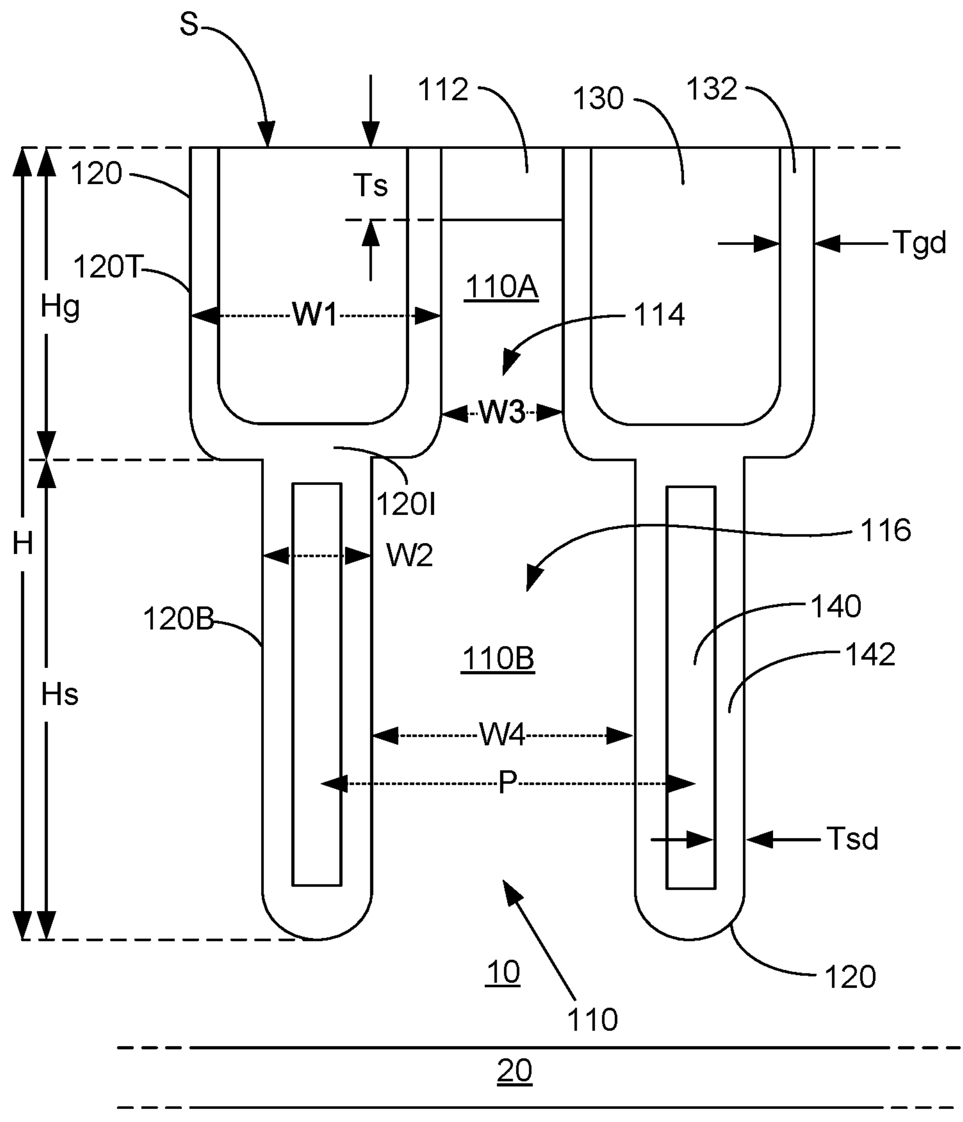
FIG. 1 illustrates a cross-sectional view of a portion of an example accumulation MOSFET, in accordance with the principles of the present disclosure.
Figure 1:
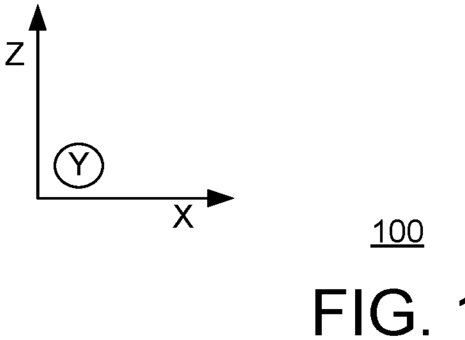

A vertical shielded-gate accumulation MOSFET device ("accumulation MOSFET" hereinafter) for power switching applications is described herein. Packing several device cells (e.g., of inversion mode MOSFETs) together can increase the current carrying capability and reduce on-resistance (e.g., Rds(on)) of the device. However, as semiconductor devices (e.g., device cell dimensions) shrink, it is increasingly difficult to reduce the cell pitch of existing designs at least because each device cell must accommodate source and body contacts of non-scalable size.

Consideration is being given to MOSFET device structures or architectures that can be scaled to reduced cell pitches, for example, through progressively smaller process technology nodes while achieving lower specific on-resistance (Rsp(on)).

As described herein, active device regions (e.g., a source region and a drift region) of the device may be formed in a mesa between two vertical trenches disposed, for example, in an epilayer deposited on a semiconductor substrate (e.g., a doped (e.g., N-doped) semiconductor substrate). The semiconductor substate may, for example, be a heavily doped N-type substrate with n-type dopants in a range of about $10^{+19}$ to $10^{+21}$ atoms/$cm^3$ or higher. Dielectric layers (e.g., a gate dielectric, a shield dielectric) are disposed on sidewalls of the vertical trenches. Current flow from the source region through the drift region to a drain region formed in the semiconductor substrate may be capacitively controlled by electrodes (e.g., a gate electrode and a shield electrode) disposed in the vertical trenches on the dielectric layers disposed on the sidewalls of the vertical trenches.

In example implementations, the mesa disposed between the two vertical trenches in the accumulation MOSFET may include a lightly doped accumulation channel or region controlled by the gate electrode, and a medium or moderately doped depletion or drift region that is depleted by the shield electrode. The lightly doped accumulation channel or region may be doped with n-type dopants, for example, in a range of, for example, about $10^{+14}$ to $5\times10^{+16}$ atoms/$cm^3$. The medium doped depletion or drift region may be doped with n-type dopants, for example, in a range of, for example, about $10^{+16}$ to $5\times10^{+18}$ atoms/$cm^3$. The drift region may be wider than the accumulation channel region. Further, the gate electrode controlling the accumulation channel or region may have a higher work function than the shield electrode. The gate electrode have a work function greater than, for example, about 5.0 eV.

In example implementations of the accumulation MOSFET, a vertical trench may have a portion (e.g., an upper trench portion) housing the gate electrode and another portion (e.g., a lower trench portion) housing the shield electrode. In example implementations, the upper portion of the trench may have a width that is greater than a width of the lower portion of the trench. Correspondingly, the mesa between the two adjoining vertical trenches may include a top mesa portion and a bottom mesa portion with a width of the top mesa portion being narrower than a width of the bottom mesa portion. In example implementations, the upper portion of the trench may have a width (e.g., in a range of about 20 nm to 1 μm) that is greater than a width of the lower portion of the trench. Correspondingly, the mesa between the two adjoining vertical trenches may include a top mesa portion and a bottom mesa portion with a width of the top mesa portion being smaller or narrower than a width of the bottom mesa portion.

The gate electrode may control current flow through an accumulation channel or region formed in the narrow top mesa portion across the gate dielectric. This narrow mesa portion may be referred to herein as the channel region, and the bottom mesa portion may be referred to herein as the drift region. In example implementations, the source region formed at a top of the channel region may be a heavily doped N+ region, the channel region may be a lightly doped N region, and drift region may be a medium (moderately) doped N region). The drain region formed at a bottom of the drift region may be a heavily doped N+ region.

In example implementations, the source region formed at a top of the channel region may be a heavily doped N-type substrate with n-type dopants in a range of, for example, about $10^{+19}$ to $10^{+20}$ atoms/$cm^3$ or higher. The source region may have a thickness or height Ts, for example, in a range of, for example, about 0.1 μm to 0.3 μm.

The accumulation MOSFET may be configured so that the device is in an off-state (i.e., pinched off) when no gate-to-source voltage (i.e., at Vgs=0 V) is applied to the gate electrode. Electrical fields at an edge of the gate oxides in the device may be small or low in the off-state so that no depleting p-n junction is required in the off-state.

To ensure that the device is in an off-state (i.e., pinched off) when no gate-to-source voltage (i.e., at Vgs=0 V) conductors with a high work function (M may be used as the conductor plate (i.e., the gate electrode, or the shield electrode) for the MOS capacitors in the device. A high work function conductor may be P+ doped poly silicon, which has, for example, a work function DM of 5.0 eV greater. Other high work function conductors may include metals such as copper, iron, platinum, palladium, or nickel that may have even higher work functions (e.g., (M (Pt)=6.0 eV) than P+ doped poly silicon. The accumulation MOSFET may be configured (with dopant concentrations, electrode materials, size and dimensions) for low or medium voltage (e.g., 10 V to 100 V) power switching applications. The accumulation MOSFET does not include a body region or a body contact (e.g., does not include a combined body-and-source contact) that would limit scaling of the device to reduced cell pitch dimensions through progressively smaller process technology nodes. The accumulation MOSFET may be implemented, for example, in short channel technologies (e.g., having a 200 nm channel length or shorter). The absence of a body region in the accumulation MOSFET may correspond to an absence of a p-n body diode in the device and may lead to an absence or reduction of reverse recovery charge (Qrr) in the accumulation MOSFET. Work function (WF) engineering of the gate and shield electrodes and implementation of a wrap-around channel may enable decoupling of current-voltage and drain current (Id) leakage characteristics of the device. In example implementations, the gate electrode may be made of material having a higher work function than the shield electrode. To protect from punch-through, the dopant concentrations in the drift region (e.g., between the source region and the drain region) may be controlled (e.g., kept at a high level) to reduce the drain region depletion width from extending to the source region.

FIG. 1 shows a cross-sectional view of a portion of an example accumulation MOSFET 100, in accordance with the principles of the present disclosure.

Accumulation MOSFET 100 may be fabricated, for example, in an epitaxial layer 10 disposed on an N+ doped substrate 20 (e.g., a doped semiconductor substrate). The N+ doped substrate may, for example, form a drain region of the accumulation MOSFET. N+ doped substrate 20 may for example, be a heavily doped N-type silicon substrate with n-type dopants in a range of about $10^{+19}$ to $10^{+20}$ atoms/$cm^3$ or higher.

Accumulation MOSFET 100 may include trenches (e.g., trench 120) that are etched in epilayer 10 disposed on substrate 20. The trenches (e.g., trench 120) may be etched vertically downward (e.g., in a negative Z direction) from a top surface S of the MOSFET (e.g., from the top surface of epilayer 10) toward the drain region (substrate 20) of the device. In example implementations, the trenches may be parallel to each other. A mesa 110 may be formed between two adjacent trenches. In example implementations, the trenches (e.g., trench 120) may have a depth or height H (in the Z direction). In example implementations, the trench height H may be in a range of, for example, about 1.0 μm to 5.0 μm.

A current handling capability of a trench MOSFET device is determined by its gate channel width. To minimize costs, it may be important to keep the transistor's die area size as small as possible and increase the width of the channel surface area (i.e., increase the "channel density") by creating cellular structures repeated over the whole area of a MOSFET die. A way to increase the channel density (and therefore increase channel width) is to reduce the size of the device cell and pack more device cells at a smaller pitch in a given surface area. A device cell of accumulation MOSFET 100 may include, for example, mesa 110 and an adjacent trench 120 (or two half trenches). The device cell may be repeated, for example in the x direction with a pitch P. In example implementations of accumulation MOSFET 100 for low or medium voltage switching applications, pitch P may be in, for example, a range of 0.25 μm to 2.0 μm (e.g., 0.75 μm).

An example accumulation MOSFET 100 may include an array of hundreds or thousands of device cells (each including a trench and an adjoining mesa). A device cell may be referred to herein as a trench-mesa cell because each device cell geometrically includes a trench and a mesa (or two half-mesas) structure, or a mesa and two half-trenches structure. Shield and gate electrodes (e.g., shield electrode 140 and gate electrode 130) may be formed inside a linear trench (e.g., trench 120) running along (e.g., aligned along) a mesa (e.g., mesa 110). Mesa 110 and the linear trench (e.g., trench 120) may have length L (extending in the Z direction, FIG. 4).

In example implementations, an upper trench portion 120T of trench 120 may have a height Hg and a width W1, and a lower trench portion 120B of trench 120 may have a height Hs and a width W2. The width W1 of upper trench portion 120T may be greater than the width W2 of the lower trench portion 120B. The gate electrode (e.g., gate electrode 130) may be disposed in upper trench portion 120T and the shield electrode (e.g., shield electrode 140) may be disposed in lower trench portion 120B. A gate dielectric (e.g., gate dielectric 132) may be disposed between gate electrode 130 and sidewalls of trench 120, and a shield dielectric (e.g., shield dielectric 142) may be disposed between shield electrode 140 and sidewalls of trench 120.

In example implementations, width W1 of upper trench portion 120T of trench 120 and width W2 of lower trench portion 120B may each be in a range of, for example, about range of 0.2 μm to 1.0 μm. The depth or height of upper trench portion 120T may be in, for example, a range of about 0.2 μm to 1.0 μm, and the depth or height of lower trench portion 120B may be, for example, about 0.5 μm to 5.0 μm.

The shield and gate electrodes may be made of polysilicon or metals having high work functions (e.g., P+ poly silicon or from metals with high work function such as platinum, palladium, or nickel). The shield and gate electrodes may be made of different conductors that have different work functions. For example, the shield electrode may be made of P+ polysilicon, while the gate electrode may be made of palladium.

The shield and gate electrodes are isolated from each other by a dielectric layer (e.g., an inter-poly dielectric (IPD) layer 120I). The IPD layer may, for example, be an oxide or nitride layer. The shield and gate electrodes are also isolated from silicon in the adjacent mesa (e.g., mesa 110) by dielectric layers (e.g., shield dielectric 142 and gate dielectric 132). The shield dielectric 142 (having a thickness Tsd) and gate dielectric 132 (having a thickness Tgd) may, for example, include silicon oxides, a high-k gate dielectric (e.g., hafnium oxide ($HfO_2$), aluminum oxide ($Al_2O_3$), etc.), or a stack of a thin layers of $SiO_2$ interface oxide (e.g., 1-5 nm thin) and layers of a high-k dielectric. In an example implementation, shield dielectric 142 may be, for example, a 50 nm thick $SiO_2$ layer, and gate dielectric 132 may be, for example, a 10 nm thick $Al_2O_3$ layer.

As shown in FIG. 1, mesa 110 (formed between adjacent trenches (e.g., trench 120) etched in epilayer 10) may include a narrow top mesa portion 110A (having a width W3 and a wider bottom mesa portion 110B having a width W4 (W4>W3) conforming to the shape of the adjacent trenches (e.g., trench 120) (having an upper trench portion 120T of width W1 that is greater than the width W2 of the lower trench portion 120B). In example implementations, width W3 of the narrow top mesa portion 110A of mesa 110 may be in a range of about range of 20 nm to 0.5 μm, and width W4 of wider bottom mesa portion 110B may be in a range of about range of 0.2 μm to 1.0 μm (W4>W3). In other words, the narrow top mesa portion 110A (having width W3) may have a narrow ribbon or fin-like shape extending vertically above a pedestal-like wider bottom mesa portion 110B.

Active device regions of accumulation MOSFET 100 may be formed in mesa 110. For example, a source region 112 (e.g., a N+ doped region) may be formed at about a top surface S of mesa 110; an accumulation channel region 114 (e.g., lightly N doped region) may be formed in narrow top mesa portion 110A of mesa 110; and a depletion or drift region 116 (e.g., a moderately doped N region) may be formed in wider bottom mesa portion 110B of mesa 110.

In example implementations, accumulation channel region 114 (a lightly doped N region) may accumulate charge based on a voltage applied to the gate electrode, and drift region 116 (a moderately doped N region) may be depleted by a voltage applied to the shield electrode. In some example implementations, work functions of the gate electrode and the shield electrode may be non-uniform along a direction of current flow (e.g., the Z direction) resulting in, for example, a dual threshold voltage device.

In example implementations, the dopant concentrations in mesa 110 (i.e., in accumulation channel region 114 and in drift region 116) may be non-uniform in the vertical direction (e.g., Z direction) and in the lateral directions (e.g., X direction). The non-uniform doping may help smoothen output capacitance.

Figure 2:
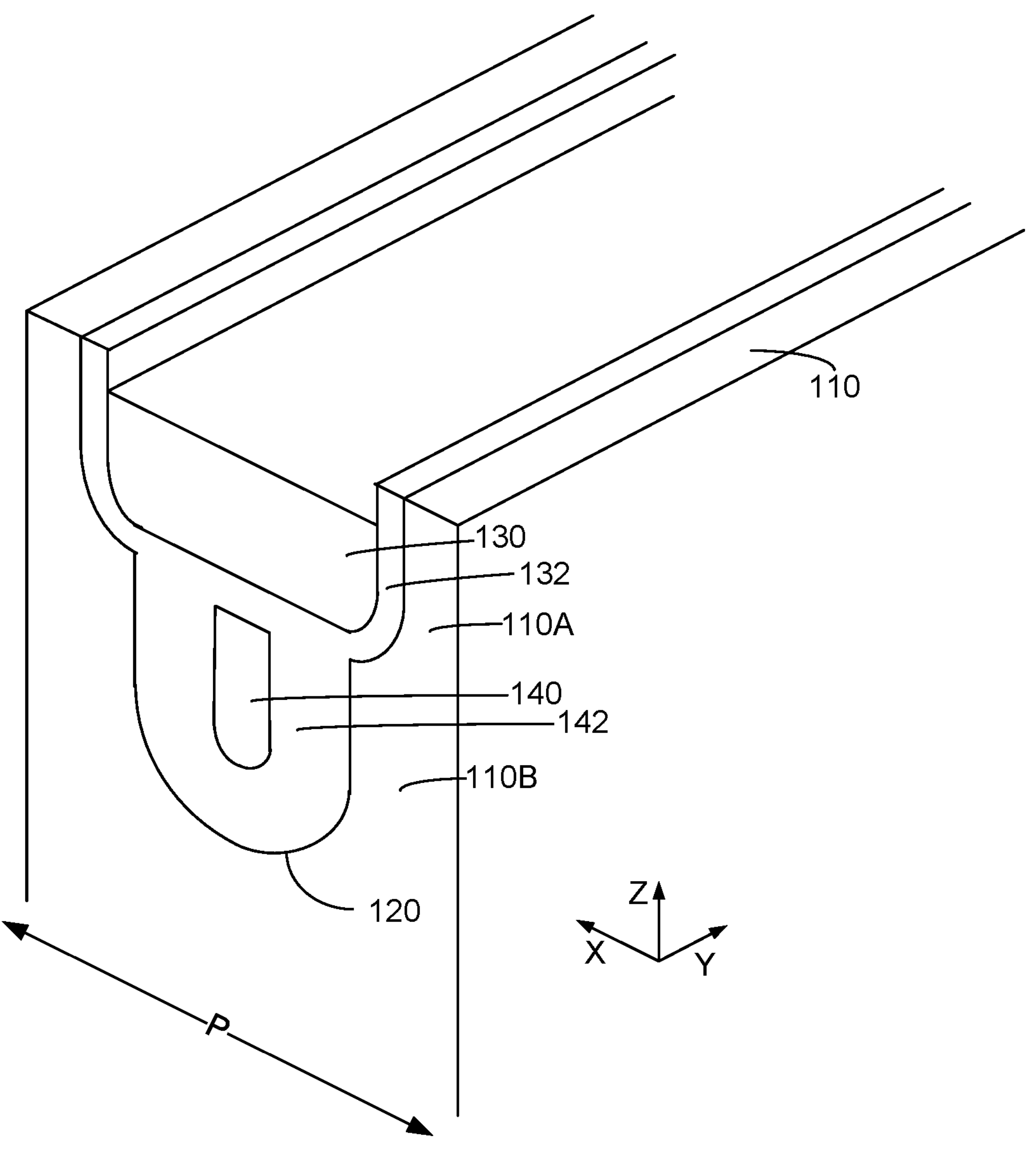
FIG. 2 illustrates an example device cell of an accumulation MOSFET with a mesa and a trench 120 laid out in a linear stripe.

In example implementations, a device layout of the accumulation MOSFET may include the mesas (e.g., mesa 110) laid out in linear stripes. FIG. 2 illustrates for example, a device cell 200 of the accumulation MOSFET with mesa 110 (and trench 120) laid out in linear stripe in the Y direction. The linear stripe layout of the mesas may provide a greater channel density than other configurations of the device layout.

Figure 3:
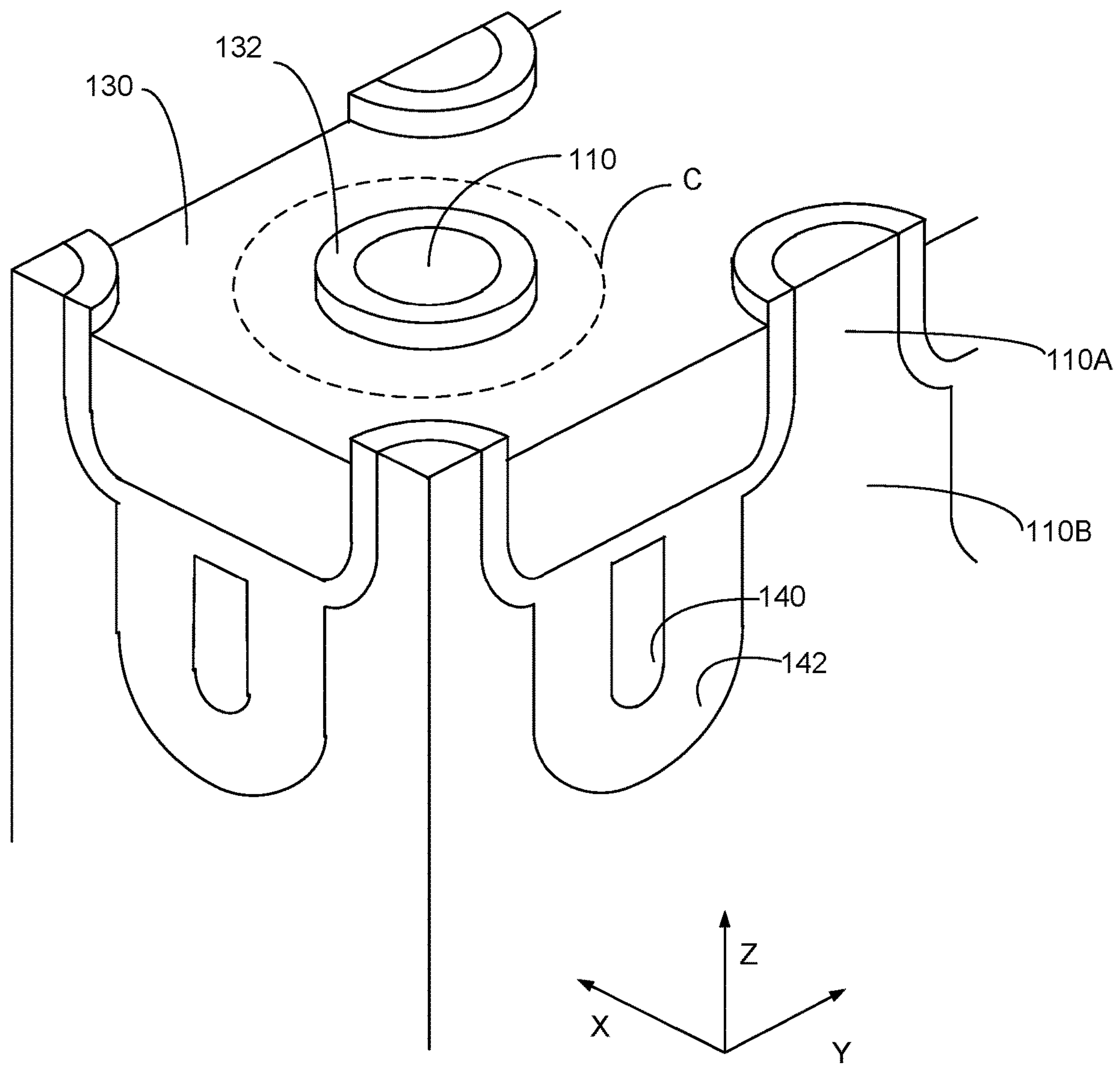
FIG. 3 illustrates an example device cell of an accumulation MOSFET having a gate-all-around (GAA) configuration.

In some example implementations, the narrow width (e.g., width W3) of the narrow top mesa portion 110A of mesa 110 may enable device layouts that include a gate-all-around (GAA) configuration of gate electrode 130. FIG. 3 shows, for example, a device cell 300 of the accumulation MOSFET laid out in columns in a GAA configuration. In FIG. 3, for purposes of illustration, the disposition of gate electrode 130 in a GAA configuration is symbolically depicted by a circle C in dashed line around mesa 110.

Figure 4:
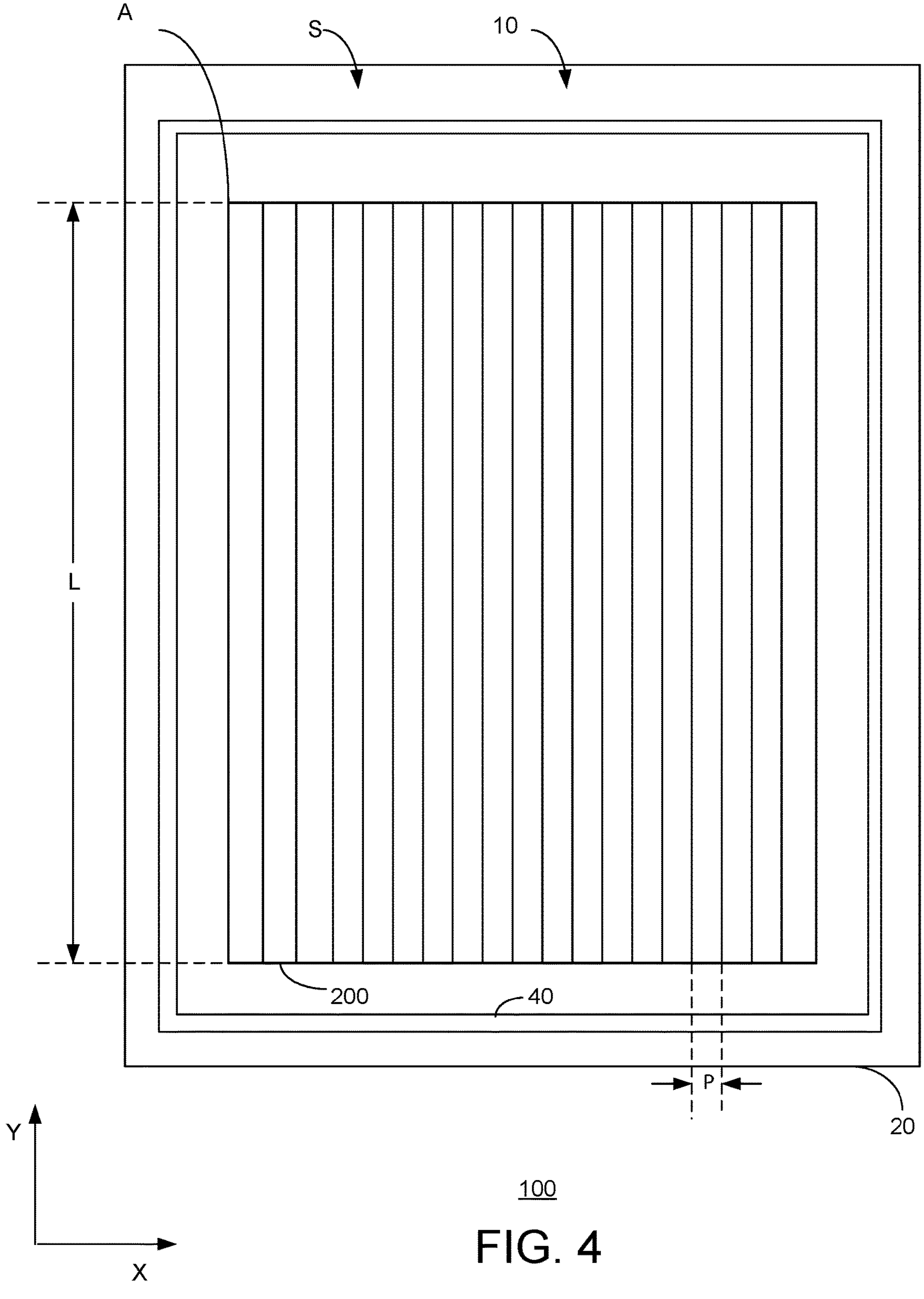
FIG. 4 illustrates a layout of device cells of an accumulated MOSFET disposed on a substrate.

In example implementations, the layout of the device cells (e.g., mesa 110 and trench 120) in accumulated MOSFET 100 may be surrounded by a p-doped ring for robustness under avalanche conditions (in other words, the device can withstand avalanche current conditions and is not destroyed when Vds exceeds an off-state voltage). FIG. 4 shows a top view of a layout of device cells (e.g., device cell 200, FIG. 2) of the accumulated MOSFET disposed on a top surface S of epilayer 10 on substrate 20. As a shown in the FIG. 4, the device cells (e.g., device cell 200) including mesas (e.g., mesa 110) having a length L may be repetitively disposed in an array with a device cell pitch P in an area A. Further, a p-doped ring 40 is disposed on the periphery of area A surrounding the layout of the device cells (e.g., device cell 200) in area A. The p-doped ring 40 may be formed by ion-implantation.

Figure 5:
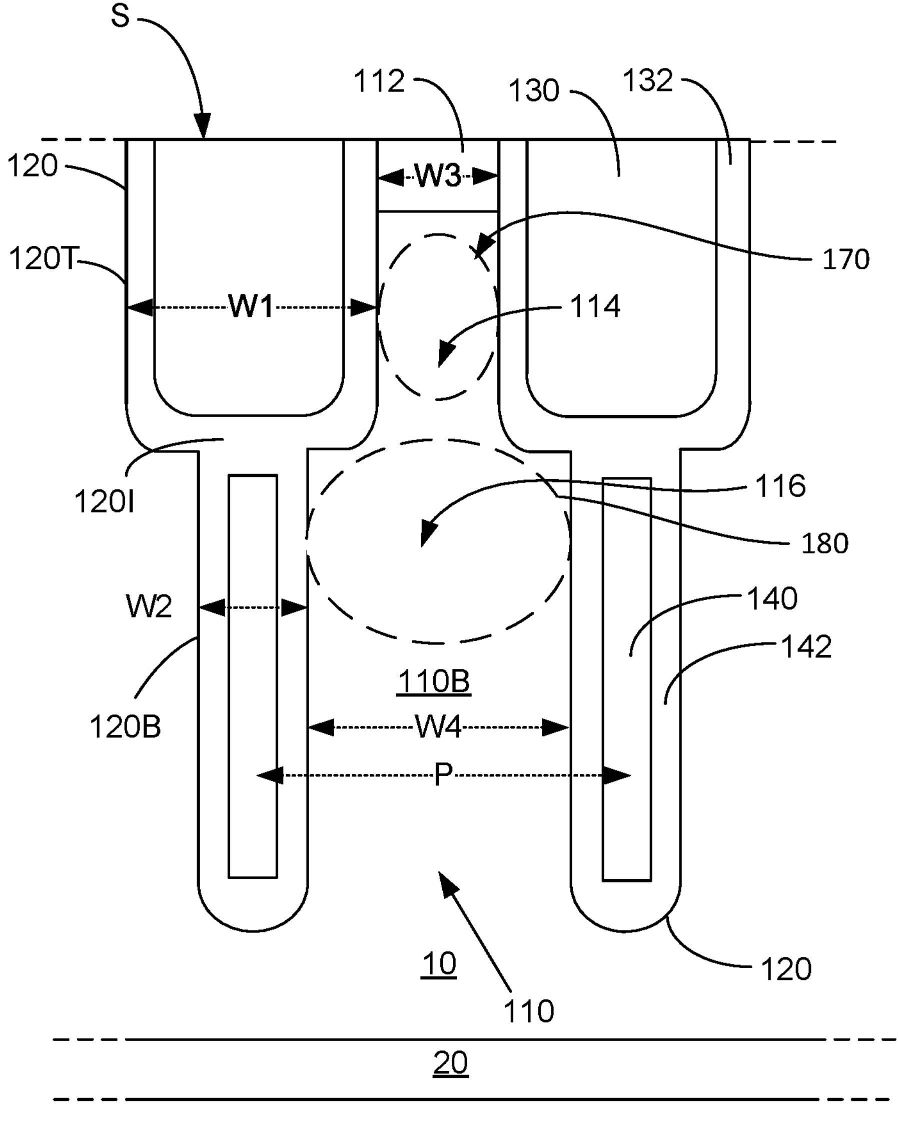
FIG. 5 illustrates a cross sectional view of a mesa and trenches in a Z-X plane and p-dopant regions disposed in the Y direction perpendicular to the plane of FIG. 5.
Figure 5:
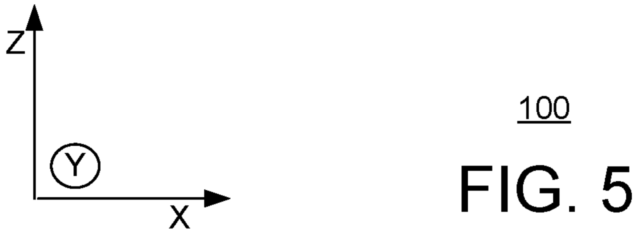

As noted previously in accumulated MOSFET 100, the mesas (e.g., mesa 110) do not include a body region or a body contact at least in the active portions of the mesas (i.e., portions that include the source region 112, accumulation channel region 114 and drift region 116). In some example implementations, as shown in FIG. 5, accumulated MOSFET 100 may include p-dopant regions (e.g., p-dopant region 170, p-dopant region 180) implanted in epilayer 10 at the ends of the mesas (e.g., at ends of the gate stripes) for avalanche robustness of the device. In one example implementation, p-dopant region 170 may be implanted at the ends of mesas in the Y direction outside the active gate regions (e.g., outside accumulation channel region 114). In another example implementation, a p-dopant region 180 may be implanted at the ends of mesas in the Y direction outside the active shield depletion regions (e.g., outside drift region 116 formed in wider bottom mesa portion 110B of mesa 110). In an example implementation, p-dopant region 170 and or p-dopant region 180 may be connected to the p-doped ring 40 of FIG. 4.

The p-dopant regions (e.g., p-dopant region 170 or p-dopant region 180) may form a shunting diode that at high breakdown (avalanche) conditions clamps voltages to protect the accumulation device from high electric fields.

In FIG. 5, which shows a cross sectional view of mesa 110 and adjoining trenches (e.g., trench 120) in the Z-X plane, p-dopant region 170 and p-dopant region 180 that are disposed in the Z direction perpendicular to the plane of FIG. 5 are depicted as dashed ovals.

In some example implementations, the shield electrodes in accumulation MOSFET 100 may extend vertically to the top surface S of the epilayer 10 through the gate electrode (gate electrode 130) in the trenches (e.g., trench 120)

Figure 6:
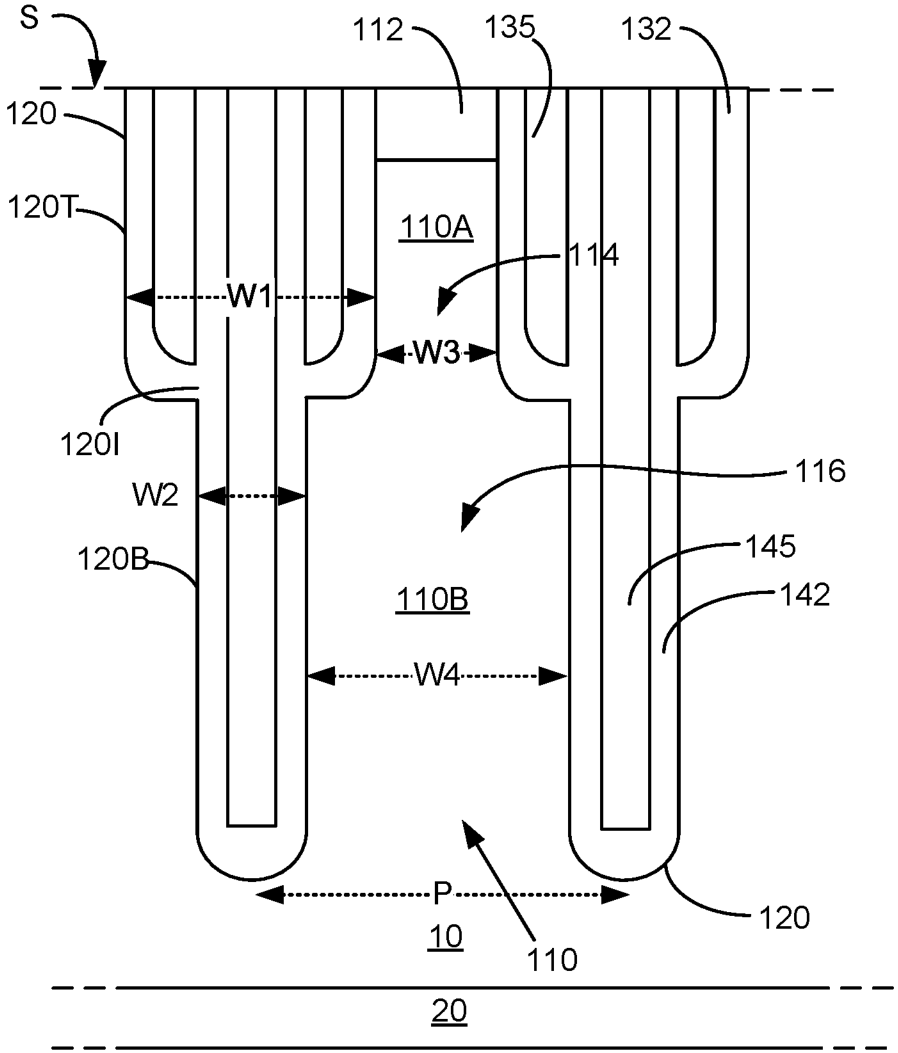
FIG. 6 illustrates an example arrangement of gate electrodes and shield electrodes in trenches in an accumulation MOSFET.
Figure 6:
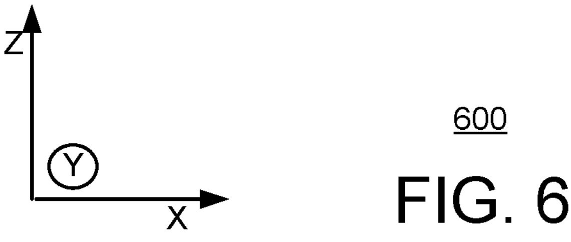

FIG. 6 shows, for example, an accumulation MOSFET 600 in which the shield electrodes (e.g., shield electrode 145) and gate electrodes (e.g., gate electrode 135) are disposed in trenches (e.g., trench 120) on adjacent sides of the mesas (e.g., mesa 110) in the device. As shown in FIG. 6, the shield electrodes (shield electrode 145) disposed in lower trench portion 120B of trench 120 extend to the top surface S of the epilayer 10 through the gate electrodes (gate electrode 135) disposed in the trenches (e.g., trench 120). An advantage of this arrangement of the shield electrodes is that the gate electrode, the shield electrodes, and the source of the device can all be contacted on a top of the device.

For some devices, a super-junction principle allows a thick drift region of a power MOSFET (i.e., a super-junction MOSFET) to be heavily doped, thereby reducing the electrical resistance to electron flow without compromising the breakdown voltage. The heavily doped region (e.g., an n-doped region) is juxtaposed with a region that is similarly heavily P doped with the opposite carrier polarity (holes). These two similar, but oppositely doped regions effectively cancel out their mobile charge and develop a depleted region that supports the high voltage during the off state. On the other hand, during the on-state, the higher doping of the drift region allows for the easy flow of carriers, thereby reducing on-resistance.

A super-junction MOSFET includes a drain structure (super-junction drain structure) in which multiple vertical p-n junctions (formed by adjoining p-type and n-type columns) are arranged in the drain region as a result of which a low on-resistance Rds(on) and reduced gate charge Qg can be realized while maintaining a high voltage. The n-type columns and p-type columns in the super-junction drain structure may be fabricated incrementally, epi level-by-level, for example, by sequentially depositing, patterning, and doping (implanting) a number of epitaxial layers of semiconductor material on a semiconductor substrate. In such a super junction drain structure, a main current path (e.g., an n-doped column) may be more heavily doped (e.g., by a factor of 10) than for a conventional high-voltage MOSFET. This lowers the on-state resistance of the drain. The current path of the p-type and n-type columns may be dimensioned so that when the transistor is turning off and developing blocking voltage, a depletion region forms with migration of the charge carriers from the p-type columns resulting in a near-neutral space charge region and high blocking-voltage capability.

Figure 7:
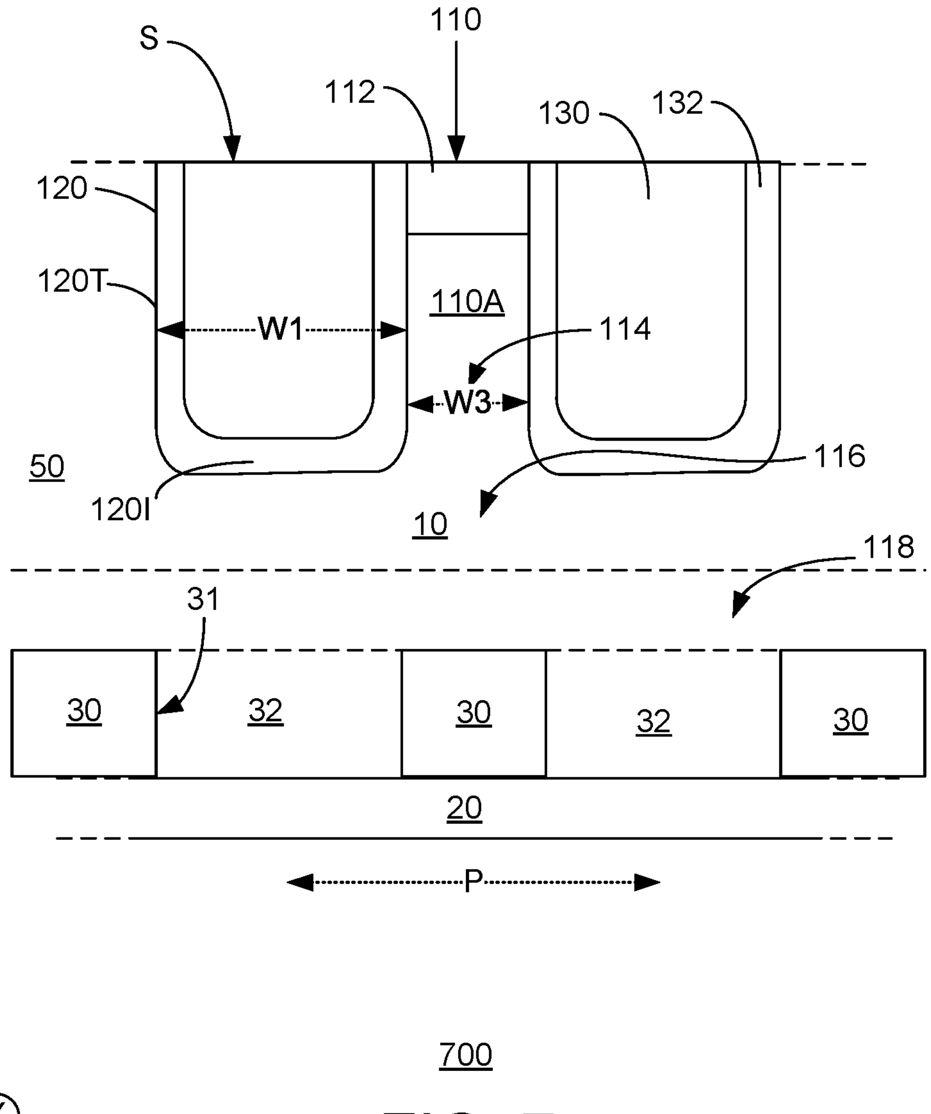
FIG. 7 illustrates a cross sectional view of an example accumulation MOSFET with a super-junction drain structure.

FIG. 7, shows, for example, an accumulation MOSFET 700 with a super-junction drain structure including p-doped columns (e.g., p-doped columns 30) disposed at the bottom of the mesas (e.g., mesa 110) in the N doped drain region (drift region 116) of the device above substrate 20. The p-doped columns (e.g., p-doped columns 30) may form vertical p-n junctions (e.g., p-n junction 31) with n-doped columns (e.g., n-doped columns 32) of formed in n-doped epilayer 10. The p-doped columns may be formed by ion implantation. Electrical contacts (not shown) to the p-doped columns 30 may be made, for example, from the Y direction. Drift region 116 of accumulation MOSFET 700 may include a current distribution layer 118 extending over the p-doped columns (e.g., p-doped columns 30) and n-doped columns (e.g., n-doped columns 32) of the super-junction drain structure.

As described above, an accumulation MOSFET (e.g., accumulation MOSFET 100) can include a lightly doped channel region and a medium doped drift region that is depleted by a shield trench. The drift region may also be wider than the channel area and the channel gate electrode controlling the channel region may have a higher work function than the shield electrode controlling the drift region.

Further, such the accumulation MOSFET may have one or more of the following characteristics: (a) a stripe or circular design (e.g., a gate-all-around (GAA) structure); (b) a non-uniform doping in a lateral and a vertical direction to smooth output capacitance; (c) a gate area that is p-type with a p+ poly contact; (d) platinum (Pt), palladium (Pd), or nickel (Ni) as a gate metal; (e) a high-k gate dielectric; (f) a stack of thin layers of silicon dioxide ($SiO_2$) interface oxide (e.g., 1-5 nanometers (nm)) and layers of a high-k dielectric; (g) a non-uniform work function along the channel region for a dual threshold voltage (Vt) device; (h) no shield trench and a p-type implant at a bottom of a mesa for a (semi) super-junction (SJ) effect with a connection in a third dimension; and (i) a p-ring in the device periphery for robustness.

In an example implementation, a low voltage accumulation MOSFET for a 30 V switching application may be configured with the following example set of dimensions and materials:

Substrate 20, N+ doped silicon;

Device cell pitch, P=750 nm;

Trench 120 depth or height, H=1.5 μm;

Upper trench portion 120T depth or height, Hg=200 nm;

Upper trench portion 120T width, W1=300 nm;

Lower trench portion 120B depth or height, Hs=1 μm;

Lower trench portion 120B width, W2=200 nm;

Source (source region 112) depth or height, Ts=20 nm;

Top mesa portion 110A width (fin width), W3=50 nm, 80 nm, or 100 nm;

Bottom mesa portion 110B width, W4=500 nm;

Dopant concentration in accumulation channel region 114, $n=1\times10^{+16}$ atoms/$cm^3$;

Dopant concentration at top of drift region 116, $n=1\times10^{+18}$ atoms/$cm^3$;

Gate electrode and shield electrode material, P+ poly, Ni, Pt, or Pd; and

Gate dielectric 132 $Al_2O_3$, and shield dielectric 142, $SiO_2$, Tsd=50 nm, Tgd=10 nm.

Figure 8:
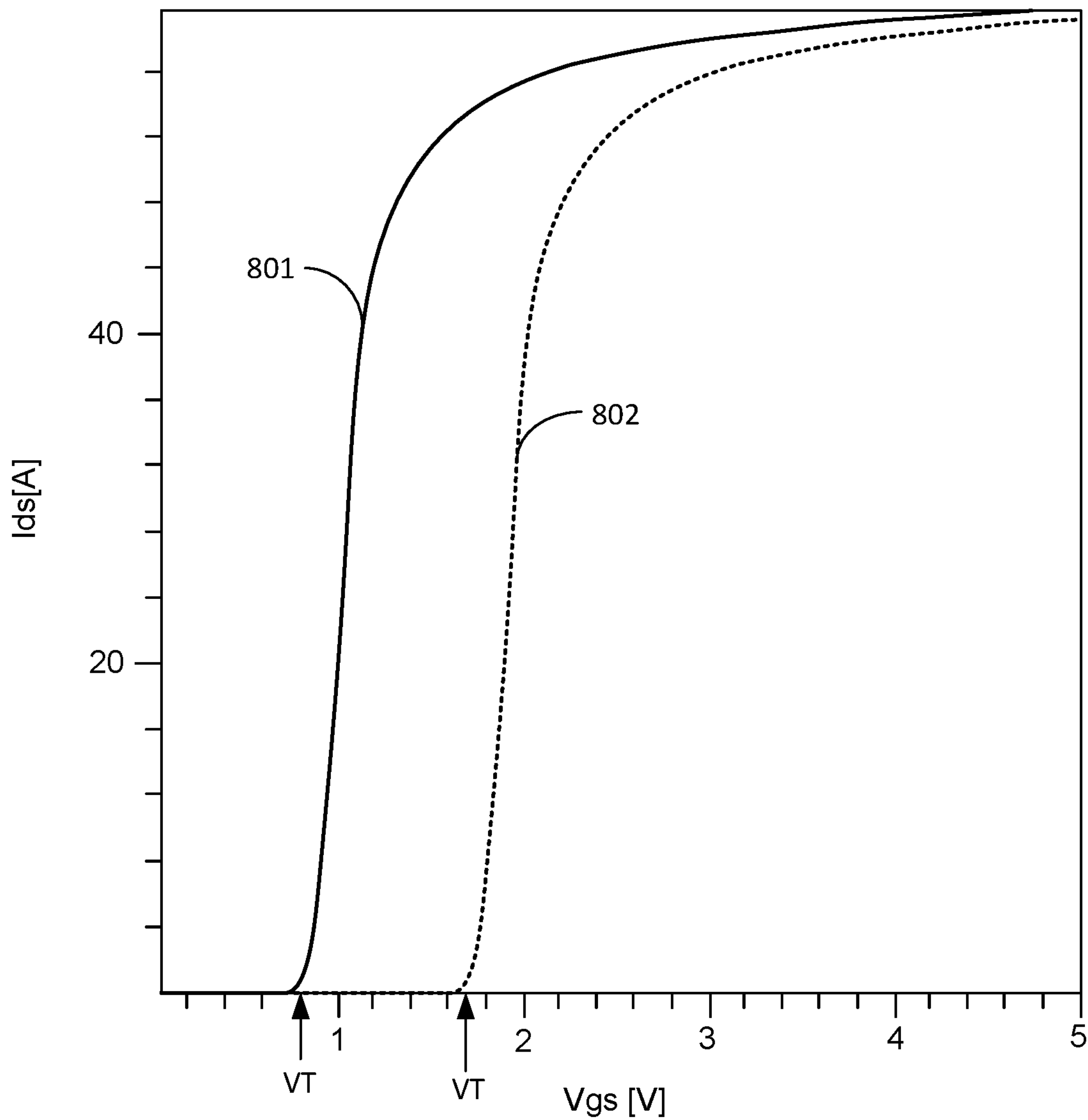
FIG. 8 and FIG. 9 illustrate example current-voltage characteristic of an example low voltage accumulation MOSFET.
Figure 9:
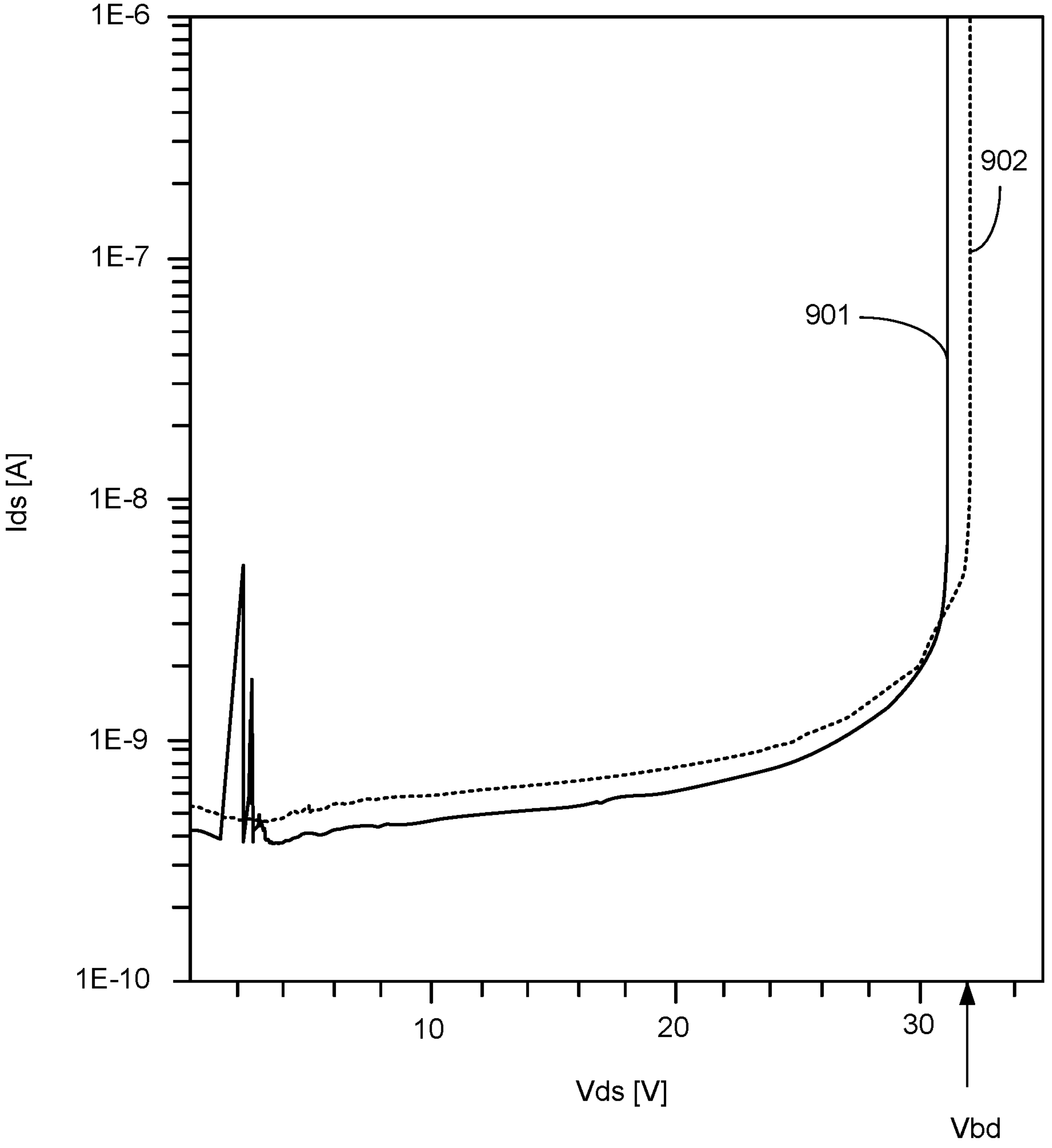

FIG. 8 and FIG. 9 show characteristic current-voltage characteristic for the foregoing example low voltage accumulation MOSFET having a fin width W3=50 nm.

FIG. 8 shows current-voltage curve 801 and current-voltage curve 802. Curve 801 represents the drain current (Ids) as a function of the gate voltage (Vgs) for the case where P+ poly is used as the gate electrode and shield electrode material. The intercept of curve 801 with the voltage axis indicates that the example accumulation FET has a gate threshold voltage VT of about 0.8 V. Curve 802 represents the drain current (Ids) as a function of the gate-source voltage (Vgs) for the case where palladium is used as the gate electrode and shield electrode material. The intercept of curve 802 with the voltage axis indicates that the example accumulation FET has a gate threshold voltage VT of about 1.7 V. For both cases where P+ poly or palladium is used as the gate electrode and shield electrode material, the accumulation MOSFETs are fully pinched off at Vgs=0 V FIG. 9 shows current-voltage curve 901 and current-voltage curve 902. Curve 901 represents the drain current (Ids) as a function of the drain-source source voltage (Vds) at Vgs=0 for the case where P+ poly is used as the gate electrode and shield electrode material. Curve 902 represents the drain current (Ids) as a function of the gate voltage (Vds) at Vgs=0 for the case where palladium is used as the gate electrode and shield electrode material. Both curve 901 and curve 902 show that the accumulation MOSFETs (for both cases where P+ poly or palladium is used as the gate electrode and shield electrode material) have a breakdown voltage Vbd of about 32V as indicated on the voltage axis in FIG. 9.

Figure 10:
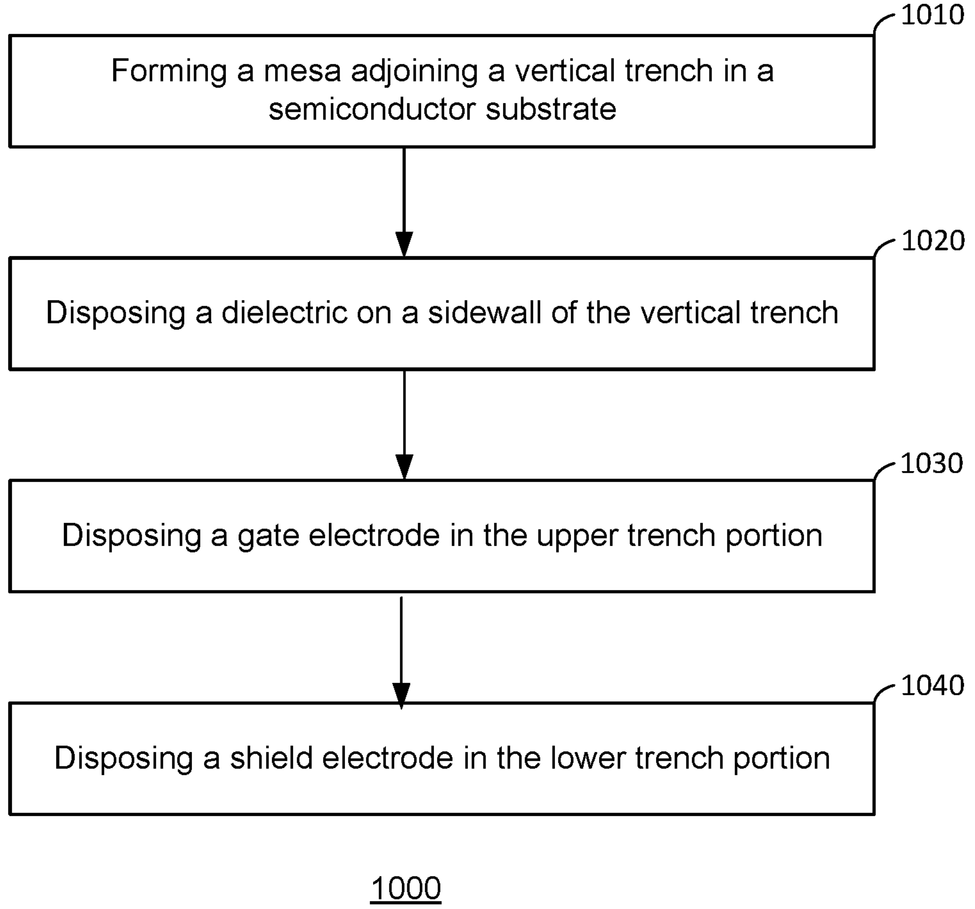
FIG. 10 illustrates an example method for fabricating a vertical shielded gate accumulation field effect transistor.

FIG. 10 shows an example method 1000 for fabricating a vertical accumulation MOSFET, in accordance with the principles of the present disclosure.

Method 1000 includes forming a mesa adjoining a vertical trench in a semiconductor substrate (1010). The semiconductor substrate may be a N-doped substrate with a n-doped epilayer disposed on top of the substrate. The mesa has a top mesa portion (e.g., a fin-like portion) disposed on a bottom mesa portion (e.g., a pedestal-like portion). The top mesa portion has a width that is narrower than a width of the bottom mesa portion. The vertical trench has an upper trench portion adjoining the top mesa portion and a lower trench portion adjoining the bottom mesa portion. The top trench portion has a width that is wider than a width of the bottom trench portion.

Method 1000 further includes disposing a dielectric on a sidewall of the vertical trench (1020) and disposing a gate electrode in the upper trench portion (1030). The gate electrode is configured to form an accumulation channel region in the top mesa portion across the dielectric disposed on the sidewall of the mesa and Method 1000 further includes disposing a shield electrode in the lower trench portion (1040). The shield electrode is configured to form a depletion drift region in the bottom mesa portion across the dielectric disposed on the sidewall of the mesa.

In example implementations, the top mesa portion may have a width between 20 nm and 100 nm (e.g., 50 nm). The accumulation channel region in the top mesa portion may be doped with n-type dopants in a range of about $1\times10^{+14}$ to $5\times10^{+16}$ atoms/$cm^3$ and the depletion drift region in the bottom mesa portion may be doped with n-type dopants in a range of about $5\times10^{+16}$ atoms/$cm^3$ to $1\times10^{+18}$ atoms/$cm^3$.

In example implementations, the gate electrode has a work function that is greater than 5.0 eV. A gate-to-source voltage, Vgs=0 V, fully pinches off the accumulation MOSFET. The gate electrode may be made of P+ doped poly silicon, or a metal including copper, iron, platinum, palladium, or nickel.

Implementations may be implemented using various semiconductor processing and/or packaging techniques. Some implementations may be implemented using various types of semiconductor processing techniques associated with semiconductor substrates including, but not limited to, for example, Silicon (Si), Silicon carbide (SiC), Gallium Arsenide (GaAs), Gallium Nitride (GaN), Gallium Oxide ($Ga_2O_3$), Indium Phosphide (InP) and/or so forth.

The terminology used herein is for the purpose of describing particular implementations only and is not intended to be limiting of the implementations. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Example implementations of the present inventive concepts are described herein with reference to cross-sectional illustrations that are schematic illustrations of idealized implementations (and intermediate structures) of example implementations. As such, variations from the shapes of the illustrations as a result, for example, of manufacturing techniques and/or tolerances, are to be expected. Thus, example implementations of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example implementations.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present implementations.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An accumulation MOSFET including a plurality of device cells, each device cell comprising:

a mesa disposed adjoining a vertical trench in a doped semiconductor substrate, the mesa having a top mesa portion disposed on a bottom mesa portion, the top mesa portion having a width that is narrower than a width of the bottom mesa portion, the vertical trench having a top trench portion adjoining the top mesa portion and a bottom trench portion adjoining the bottom mesa portion, the top trench portion having a width that is wider than a width of the bottom trench portion;

a dielectric disposed on a sidewall of the vertical trench;

a gate electrode disposed in the top trench portion, the gate electrode being configured to form an accumulation channel region in the top mesa portion across the dielectric disposed on the sidewall of the mesa; and a shield electrode disposed in the bottom trench portion, the shield electrode being configured to form a depletion drift region in the bottom mesa portion across the dielectric disposed on the sidewall of the mesa, wherein the gate electrode has a work function that is greater than a work function of the shield electrode.

2. The accumulation MOSFET of claim 1, further comprising:

a N+ doped source region disposed above the accumulation channel region in the top mesa portion; and a N+ doped drain region disposed below the depletion drift region in the bottom mesa portion.

3. The accumulation MOSFET of claim 1, wherein the accumulation channel region is doped with n-type dopants in a range of about $1\times10^{+14}$ to $5\times10^{+16}$ atoms/$cm^3$ and the depletion drift region is doped with n-type dopants in a range of about $5\times10^{+16}$ atoms/$cm^3$ to $1\times10^{+8}$ atoms/$cm^3$.

4. The accumulation MOSFET of claim 1, wherein a gate-to-source voltage, Vgs=0 V, fully pinches off the accumulation MOSFET.

5. The accumulation MOSFET of claim 1, wherein the gate electrode has a work function greater than 5.0 eV.

6. The accumulation MOSFET of claim 5, wherein the gate electrode is made of P+ doped poly silicon, or a metal including copper, iron, platinum, palladium, or nickel.

7. The accumulation MOSFET of claim 1, wherein each device cell is laid out in a stripe structure with a stripe width between 500 nm and 1000 nm, and the top mesa portion has a width between about 40 nm and 100 nm.

8. The accumulation MOSFET of claim 1, wherein each device cell is laid out in a stripe structure, wherein the mesa is a linear mesa, and the accumulation MOSFET further includes a p-dopant region disposed at an end of the linear mesa.

9. The accumulation MOSFET of claim 1, wherein each device cell has a columnar structure, and the gate electrode is disposed in a gate-all-around configuration around the top mesa portion.

10. The accumulation MOSFET of claim 1, wherein the plurality of device cells is disposed in an array in an area, and the accumulation MOSFET further includes a p-doped ring disposed on a periphery of the area.

11. The accumulation MOSFET of claim 1, wherein the dielectric disposed on a sidewall of the top trench portion includes a high-k dielectric, or a stack of layers of silicon dioxide ($SiO_2$) interface oxide and layers of a high-k dielectric.

12. The accumulation MOSFET of claim 1, wherein the shield electrode disposed in the bottom trench portion extends through the gate electrode disposed in the top trench portion to a top surface of the accumulation MOSFET, and the shield electrode and the gate electrode are isolated from each other by an inter-poly dielectric layer.

13. An accumulation metal-oxide-semiconductor field-effect transistor (MOSFET), comprising:

a mesa formed between a pair of vertical trenches in a semiconductor substrate, the mesa having a top mesa portion disposed on a bottom mesa portion, the top mesa portion having a width that is narrower than a width of the bottom mesa portion, the mesa including an accumulation channel region and a drift region;

a source region disposed in the mesa;

a dielectric disposed on a sidewall of mesa;

a gate electrode disposed in the pair of vertical trenches, the gate electrode being biased to form the accumulation channel region in the top mesa portion across the dielectric disposed on the sidewall of the mesa; a super-junction structure including a n-doped column and a p-doped column disposed on the semiconductor substrate; and a current redistribution layer disposed between the mesa and the super-junction structure.

14. The accumulation MOSFET of claim 13, further comprising a N+ doped source region disposed above the accumulation channel region in the top mesa portion and a N+ doped drain region disposed below the depletion drift region in the bottom mesa portion.

15. The accumulation MOSFET of claim 13, wherein the top mesa portion has a width between 20 nm and 100 nm.

16. The accumulation MOSFET of claim 13, wherein the gate electrode has a work function greater than 5.0 eV.

17. The accumulation MOSFET of claim 13, wherein a gate-to-source voltage, Vgs=0 V, fully pinches off the accumulation MOSFET.

18. The accumulation MOSFET of claim 13, wherein the current redistribution layer is formed in a n-type doped epitaxial layer disposed on the semiconductor substrate.

19. A method for fabricating an accumulation MOSFET, the method comprising:

forming a mesa adjoining a vertical trench in a doped semiconductor substrate, the mesa having a top mesa portion disposed on a bottom mesa portion, the top mesa portion having a width that is narrower than a width of the bottom mesa portion, the vertical trench having a top trench portion adjoining the top mesa portion and a bottom trench portion adjoining the bottom mesa portion, the top trench portion having a width that is wider than a width of the bottom trench portion;

disposing a dielectric on a sidewall of the vertical trench;

disposing a gate electrode in the top trench portion; the gate electrode configured to form an accumulation channel region in the top mesa portion across the dielectric disposed on the sidewall of the mesa; and disposing a shield electrode in the bottom trench portion, the shield electrode configured to form a depletion drift region in the bottom mesa portion across the dielectric disposed on the sidewall of the mesa wherein the gate electrode has a work function that is greater than a work function of the shield electrode.

20. The method of claim 19, wherein the accumulation channel region in the top mesa portion is doped with n-type dopants in a range of about $1\times10^{+14}$ to $5\times10^{+16}$ atoms/$cm^3$ and the depletion drift region is doped with n-type dopants in a range of about $5\times10^{+16}$ atoms/$cm^3$ to $1\times10^{+18}$ atoms/$cm^3$.

21. The method of claim 19, wherein the gate electrode and the shield electrode each have a work function that is greater than 5.0 eV.

22. The method of claim 19, wherein a gate-to-source voltage, Vgs=0 V, fully pinches off the accumulation MOSFET.

23. The method of claim 19, wherein the gate electrode is made of P+ doped poly silicon, or a metal including copper, iron, platinum, palladium, or nickel.

24. The method of claim 19, wherein the top mesa portion has a width between 20 nm and 100 nm.

25. The method of claim 19, wherein the shield electrode disposed in the bottom trench portion extends through the gate electrode disposed in the top trench portion to a top surface of the accumulation MOSFET, and the shield electrode and the gate electrode are isolated from each other by an inter-poly dielectric layer.

* * * * *